United States Patent [19]

Tanaka et al.

[11] Patent Number: 4,680,534
[45] Date of Patent: Jul. 14, 1987

[54] DRIVE METHOD FOR SWITCHING POWER CONVERTER AND APPARATUS USING THIS METHOD

[75] Inventors: Yoshio Tanaka, Kanagawa; Toshihiro Onodera, Tokyo, both of Japan

[73] Assignee: Kabushiki Kaisha Toshiba, Kawasaki, Japan

[21] Appl. No.: 843,383

[22] Filed: Mar. 24, 1986

[30] Foreign Application Priority Data

Mar. 29, 1985 [JP] Japan .................................. 60-65238
Jan. 30, 1986 [JP] Japan .................................. 61-18716

[51] Int. Cl.⁴ .............................................. G05F 1/56
[52] U.S. Cl. ...................................... 323/290; 323/272
[58] Field of Search ................................ 323/271–272, 323/282, 284, 285, 289, 290, 350–351; 307/270, 280, 300

[56] References Cited

U.S. PATENT DOCUMENTS 4,187,458 2/1980 Milberger et al. ................... 323/290
4,348,598 9/1982 Smith .............................. 323/290 X

OTHER PUBLICATIONS

"A New Improved and Simplified Proportional Base Drive Circuit", Rudy Severns, Intersil, Inc. Proceeding of Powercon 6, May 1979, pp. B2-1 to B2-12.
"Pulse Synchronizing DC-to-DC Converter", Koosuke Harada, et al., IEEE Transaction on Aerospace and Electronic Systems vol. AES-17 No. 3, Mar. 1981, pp. 322–328.
"Inverter for Use with Very Low Input Voltage", T. G. Wilson, E. T. Moore, IEEE Trans(Communication and Electronics), vol. 83, pp. 424–428, Jul. 1964.

*Primary Examiner*—Peter S. Wong
*Attorney, Agent, or Firm*—Oblon, Fisher, Spivak, McClelland & Maier

[57] ABSTRACT

A main switch consisting of a switching transistor and a current transformer is triggered at the leading edge of a main switch drive pulse. The switching transistor then starts a positive feedback operation through the current transformer and is turned on at high speed. Upon activation of the switching transistor, the magnetic core of the current transformer is saturated by the switching transistor emitter current flowing in the current transformer. Magnetic saturation of the core turns off the switching transistor with the magnetic energy stored in the current transformer. The main switch drive pulse falls after the switching transistor is turned off.

10 Claims, 14 Drawing Figures

DRIVE METHOD FOR SWITCHING POWER CONVERTER AND APPARATUS USING THIS METHOD

BACKGROUND OF THE INVENTION

The present invention relates to a drive method for a switching power converter such as a DC/DC converter and to an apparatus using this method.

In general, high efficiency, high-speed switching and compactness are required of switching power converters. One approach to satisfy the last of these demands is to provide a low-power driver for the converter main switch. One way of achieving such a low-power driver is to reduce the drive current supplied to the main switch by using Darlington-connected bipolar transistors in the main switch. Darlington-connected transistors are equivalent to a transistor having a large current amplification factor (hFE). Therefore, the power required to drive such transistors is less than that required to drive a single low hFE power transistor. However, in actual circuit operation, the effective collector-emitter saturation voltage VCE(sat) of Darlington-connected transistors is twice or more that of a single power transistor. Thus, power loss incurred to the Darlington-connected transistors in the ON period of the main switch is twice or more that for a single power transistor. This is contradictory to the demand for high efficiency.

In Darlington-connected transistors, two or more transistors are sequentially (or time-serially) turned on and off. Therefore, when Darlington-connected transistors are used in the main switch, switching speed is lower than that obtained with a single transistor. This is contradictory to the demand for high-speed switching.

Thus, the two problems of increased power loss and reduced switching speed are encountered when Darlington-connected transistors are used in the main switch of a power converter.

As another means of drivng the main switch of a power converter at low power, an MOS power FET is used in the main switch. The gate input impedance of an MOSFET is much higher than the base input impedance of a bipolar transistor. Therefore, power required for driving an MOSFET is much smaller than that required for driving a bipolar transistor. In addition, MOS power FETs generally have higher switching speeds that bipolar power transistors and can realize high-speed switching at 100 kHz or higher.

When an MOS power FET is used for large current (10 A or more) switching, power loss increases significantly. This is because the drain-source voltage drop in the ON period of an MOSFET, in which a drain current flows, becomes 3 times or more the VCE(sat) of a bipolar transistor, in which a collector current of the same magnitude as the above drain current flows. This is again contradictory to the demand for high efficiency.

Thus, when an MOSFET is used in the main switch of a power converter to reduce its drive power, the problem of increased power loss is encountered.

The following reference disclosed one prior art solution to the problems encountered when Darlington-connected transistors (low efficiency, low-speed switching) or MOSFETs (low efficiency) are used:

"A NEW IMPROVED AND SIMPLIFIED PROPORTIONAL BASE DRIVE CIRCUIT", Rudy Severens, Intersil, Inc., Proceedings of Powercon 6, May, 1979, pp. B2-1 to B2-12. In the power converter disclosed in the Rudy document, a positive current feedback is effected, through a current transformer using a saturable reactor, by a bipolar power transistor which serves as a main switch. In the Rudy power converter, a switching device having a high power loss such as Darlington-connected transistors or MOSFET is not used. Instead, a single bipolar transistor is used to constitute the main switch. Therefore, power conversion efficiency is high. In addition, since the positive feedback operation in combined with ON/OFF operation of the single bipolar transistor, switching speed is also high.

In the Rudy power converter, however, the main switch is compulsorily turned off by an output from the drive circuit. Therefore, the main switch driver requires high power to reliably turn off the main switch.

In other words, the Rudy power converter cannot satisfy the low-power consumption requirement for the main switch driver, and the overall power converter cannot be rendered compact.

All disclosures of the Rudy document are incorporated in this application.

SUMMARY OF THE INVENTION

It is accordingly a first object of the present invention to provide a drive method for a switching power converter, in which drive power of a main switch can be reduced without increasing power loss or reducing switching speed.

It is a second object of the present invention to provide a switching power converter which uses the above method.

To achieve the first object of the present invention, the main switch of a switching power converter using the method of the present invention comprises a current transformer having primary, secondary and tertiary windings wound around a magnetic core, and a bipolar switching transistor, the base-emitter or base-collector path of which is positively feedback-coupled through the primary and secondary windings of the current transformer.

In the method of the present invention, the switching transistor is turned on, with a positive feedback operation through the current transformer, by the leading edge of a current pulse applied as a trigger to the tertiary winding of the current transformer. Since the drive circuit need only provide a trigger pulse to start the positive feedback operation of the switching transistor, the power required for turning on the switching transistor is low. Further, the turn-on speed is high since a positive feedback operation is utilized.

The switching transistor is turned off, with magnetic energy stored in the current transformer, by a current flowing in the ON period of the switching transistor. Thus, after elapsing a predetermined period of time from the time of turn-on of the switching transistor, the core of the current transformer is magnetically saturated by the ON current of the switching transistor. Upon this saturation, the magnetic permeability of the core abruptly decreases to a value equivalent to that of air, and the inductance of the secondary winding of the current transformer coupled to the base-emitter path of the switching transistor is abruptly reduced. At this time, since a certain voltage is still being applied to the base-emitter path of the switching transistor, the current which has been flowing to the primary winding of the current transformer flows instead to the secondary winding (with the reduced inductance) in such a direction as to turn off the switching transistor. The secondary winding current triggers the positive feedback operation through the saturated current transformer, and the switching transistor is immediately turned off. Since power for turning off the switching transistor is obtained from the magnetic energy stored in the current transformer, drive power for turning off the switching transistor need not be separately supplied from the drive circuit. Furthermore, since the switching transistor is turned off by a positive feedback operation with a small time constant corresponding to the inductance obtained when the secondary winding of the current transformer is saturated, turn-off speed is also high.

According to the method of the present invention, the switching transistor is turned on by a positive feedback operation at the leading edge of the voltage pulse for driving the main switch. The switching transistor is turned off by using magnetic energy stored in the current transformer by a positive feedback operation triggered by magnetic saturation of the current transformer. The trailing edge of the drive voltage pulse is set to be after the turn-off of the switching transistor.

Since this method allows low power drive without requiring use of Darlington-connected transistors or MOS power FET having large power loss for a main switch, power conversion efficiency can be made high. Since positive feedback is used for ON/OFF operation of the switching transistor, high speed switching can be performed. Since the drive voltage pulse falls after the switching transistor is turned off, substantially no power is consumed by the main switch at the trailing edge of the voltage pulse. In addition, drive power for turning on the switching transistor is needed only to trigger a positive feedback operation, so that drive power for the main switch can be reduced.

In order to achieve the second object of the present invention, the method of achieving the first object is used as the drive method for the main switch of a switching transistor.

DETAILED DESCRIPTION OF THE PREFERRED EMBODIMENTS

The preferred embodiments of the present invention will be described with reference to the accompanying drawings.

Figure 1:
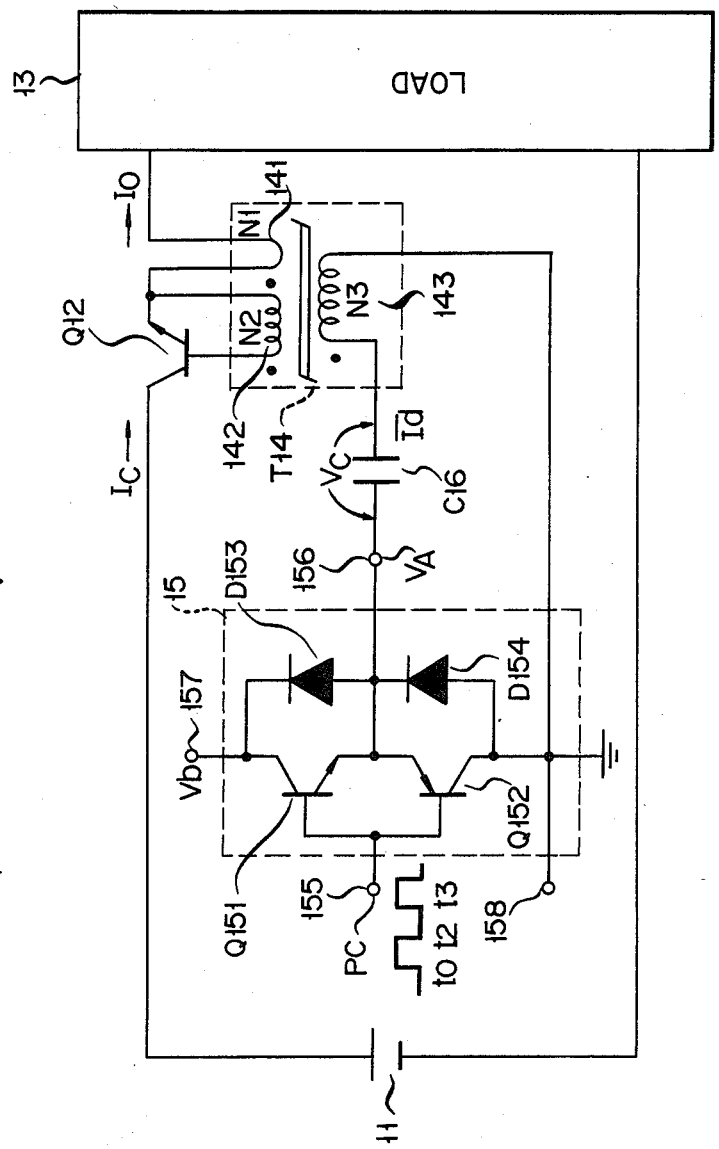
FIG. 1 is a circuit diagram of an embodiment of a switching power converter to which the method of the present invention is applied.

FIG. 1 is a circuit diagram of an embodiment of a switching power converter to which the method of the present invention is applied. Referring to FIG. 1, reference numeral 11 denotes a power source; Q12, a switching transistor using an npn bipolar transistor; and 13, a load. The positive terminal of power source 11 is coupled to one end of load 13 through the collector-emitter path of transistor Q12. The other end of load 13 is coupled to the negative terminal of power source 11, thereby forming a closed power transmission circuit.

A positive feedback loop is formed in the base-emitter path of transistor Q12 through primary and secondary windings 141 and 142 of current transformer T14 using a saturable core. Emitter current Io, substantially equivalent to collector current Ic of transistor Q12, flows to primary winding 141 having N1 turns. A current component corresponding to current Io is positively fed back to secondary winding 142 having N2 turns through the magnetic coupling of current transformer T14. In other words, a positive current feedback loop is formed by the magnetic coupling of current transformer T14 in the base-emitter path of transistor Q12.

A rectangular drive voltage pulse for driving transistor Q12 is supplied from driver circuit 15. Circuit 15 consists of npn transistor Q151 and pnp transistor Q152, which constitute a complementary emitter follower, and protection diodes D153 and D154, which are connected in parallel to the collector-emitter paths of transistors Q151 and Q152, respectively. Driver circuit 15 drives tertiary winding 143 of current transformer T14, which has N3 turns. Circuit 15 has an output impedance sufficiently smaller than the excitation impedance of current transformer T14.

Transistors Q151 and Q152 are alternately turned on and off in accordance with the signal level of control pulse PC applied to terminal 155. The collector of transistor Q151 is connected to terminal 157, and the collector of transistor Q152 is connected to terminal 158. Rectangular drive voltage pulse VA, having the same magnitude as voltage Vb applied to terminal 157 and the same waveform as control pulse PC, appears at output terminal 156 of driver circuit 15.

Terminal 156 is connected through capacitor C16 to one end of tertiary winding 143 of current transformer T14 having N3 turns. The other end of winding 143 is connected to circuit-ground terminal 158 of driver circuit 15. Voltage pulse VA is supplied, as a current pulse, from terminal 156 to winding 143 through capacitor C16. The current pulse is then supplied, through the magnetic coupling between windings 143 and 142, to the base of transistor Q12 so as to turn it on.

The operation of a circuit having the configuration shown in FIG. 1 will be described with reference to the waveforms shown in FIGS. 2A to 2E.

It is assumed that the capacitance of C16 and the value of voltage Vb are selected so that voltage vc(t0)

across capacitor C16 and amplitude Vb of drive voltage pulse VA at time t0 satisfy:

$$Vb \geq vc(t0) + (N3/N2)VBE(sat) \quad (1)$$

where N2 is the number of turns of winding 142, N3 is the number of turns of winding 143, and VBE(sat) is the base-emitter voltage obtained when the collector-emitter path of transistor Q12 is saturated.

Figure 2A:
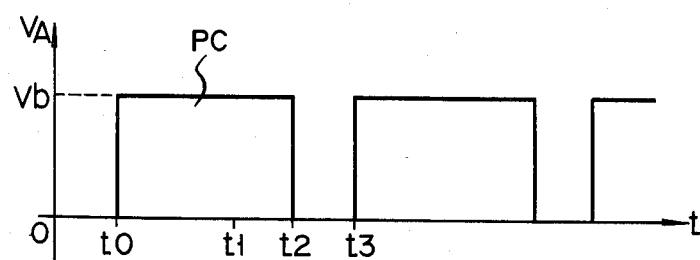
FIGS. 2A to 2E are waveform charts explaining the mode of operation of the power converter shown in FIG. 1.
Figure 2B:
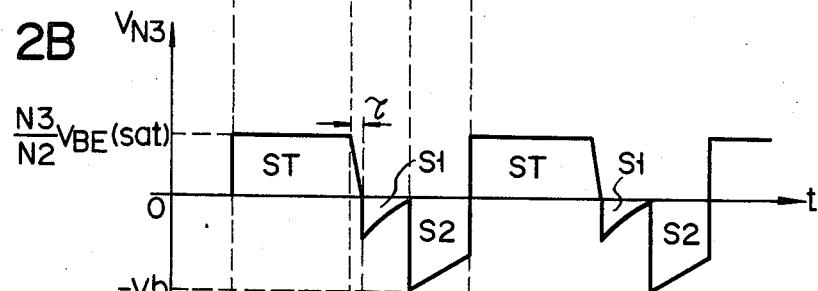
Figure 2C:
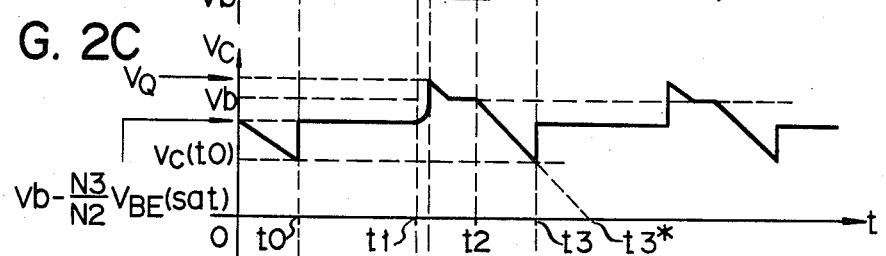

(1) Assume that transistor Q151 of driver circuit 15 is turned on at the leading edge of pulse VA at time t0. Then, when equation (1) is satisfied or when voltage vc(t0) appearing across capacitor C16 is smaller than voltage Vb, pulse current Id, directed to winding 143, flows from terminal 156 to capacitor C16. Capacitor C16 is quickly charged by current Id and voltage vc abruptly increases from vc(t0) to:

$$Vb - (N3/N2) \times VBE(sat) \quad (2)$$

at time t0 in FIG. 2C.

Capacitor C16 differentiates pulse current Id with respect to time and converts the differentiated pulse current into a sharp impulse current. The impulse current thus obtained is supplied to the base of transistor Q12 through windings 143 and 142. Base current IB of transistor Q12 becomes an impulse as indicated by P in FIG. 2D. Impulse base current P triggers to turn on transistor Q12.

Figure 2D:
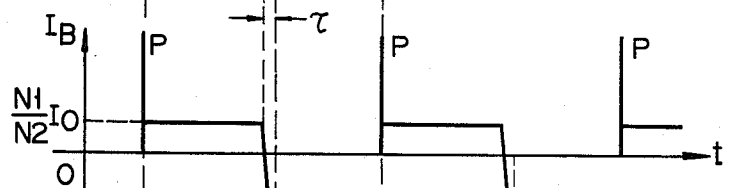

When base current P triggers to turn on transistor Q12 and emitter current Io starts flowing to winding 141 at time t0, base current IB continues to flow, with a current positive feedback loop containing windings 141 and 142 of current transformer T14, during the interval between times t0 and t1 in FIG. 2D. The time interval (t1−t0) depends on magnetic flux density difference ΔB (cf. FIG. 3) of the minor loop in the hysteresis characteristic of the magnetic core used for current transformer T14. More specifically, when the cross-sectional area of the core is represented by S, the time interval is given by;

$$t1 - t0 = \{(\Delta B \times S \times N2)/VBE(sat)\} \times 10^{-8} - \tau(sec) \quad (3)$$

where $\tau$ is the time required for transistor Q12 to turn off completely after it starts to turn off.

(2) When the magnetic core of current transformer T14 begins to become saturated by the current flowing through windings 141 and 142 at time t1 (which falls within the time interval in which upper transistor Q151 of driver circuit 15 is turned on), excitation inductance Lm(t) of current transofmrer T14 gradually decreases from time t1 to time t1+$\tau$. This decrease in inductance corresponds to saturation of the magnetization curve of current transformer T14, as indicated in the interval from time t1 to time t1+$\tau$ in FIG. 3. Excitation current Im(t) increases in proportion to the decrease in excitation inductance Lm(t). Consequently, even if excitation inductance Lm(t) decreases, the excitation energy stored in current transformer T14 is retained. Therefore, as Lm(t) decreases in the time interval from time t1 to time t1+$\tau$, current Im(t) gradually increases to satisfy:

$$Im(t) = (VBE(sat)/Ls)t \quad (4)$$

for t1≤t≤t1+$\tau$, where Ls denotes the inductance of saturated current transformer T14.

When the current flowing through windings 141 and 142 is considered in view of this, emitter current Io, substantialy equal to collector current Ic of transistor Q12, flows to winding 141. Meanwhile, current IB(t), given by:

$$IB(t) = (N1/N2)Io - Im(t) \quad (5)$$

(where emitter current Io corresponds to the switching output current of the power converter shown in FIG. 1), is supplied from winding 142 to the base of transistor Q12.

Figure 4:
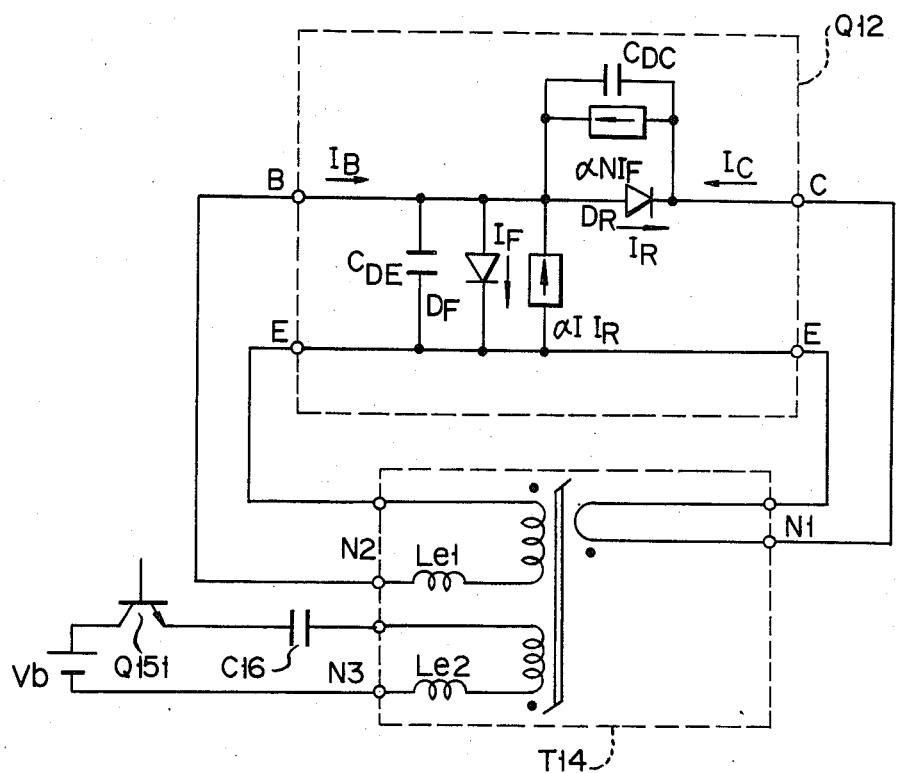
FIG. 4 is an equivalent circuit diagram explaining the mode of operation of a main switch (Q12+T14) of the power converter shown in FIG. 1.

The value of excitation current Im(t) given in equation (5) increases during the time interval (t1−t1+$\tau$) in which the core of current transformer T14 is magnetically saturated, while satisfying equation (4). Thus, current IB(t) starts to decrease during the time interval in which the magnetic core approaches its complete saturation state. During this time interval, substantially linearly increasing current Im(t) flows to winding 142 in accordance with voltage VBE appearing across diffusion capacitance CDE (FIG. 4) of the base-emitter p-n junction of transistor Q12. When the winding inductance upon saturation of the core of current transformer T14 is represented by Ls, current Im(t) is given by:

$$Im(t) = (VBE(0)Ls)t \quad (6)$$

where VBE(0) is VBE at t=t1.

When reverse injection current IR which flows into diode DR formed in the base-collector path of transistor Q12 becomes zero, transistor Q12 is immediately cut off by a weak positive feedback through windings 141 and 142 (t1+$\tau$ in FIG. 2D). The reason why the positive feedback is "weak" is that the magnetic coupling has been reduced by the core saturation. As the core becomes saturated during time interval (t1−t1+$\tau$), a current flows to winding 143. This current charges capacitor C16 so that voltage Vc across capacitor C16 is increased to VQ which is higher than the voltage given by Vb−(N3/N2)VBE(sat) in equation (2) (at time t1+$\tau$ in FIG. 2C). Then, a reverse voltage corresponding to difference ΔVQ (=VQ−Vb) between two voltages VQ and Vb is applied to winding 143, and the magnetic core of current transformer T14 begins to be reset as shown in time interval (t1+$\tau$−t2) in FIG. 3. The charge corresponding to difference voltage VQ is discharged through diode D153 within a relatively short period of time.

(3) Lower transistor Q152 of driver circuit 15 is turned on at time t2. Then, voltage vc appearing across capacitor C16 is applied to winding 143, so that the magnetic core of current transformer T14 remains to be reset. In this case, voltage vc(t) of capacitor C16 decreases with a roughly fixed gradient as shown in time interval (t2−t3) in FIG. 2C. In this case, the value of vc(t) can be approximated by:

$$vc(t) = Vb - (Im3/C16)t \quad (7)$$

using excitation current Im3 (which depends on the magnetic coercive force of the core) for the core in view of winding 143, provided t2≤t≤t3.

Lower transistor Q152 of driver circuit 15 is turned on during time interval (t2−t3). Area S2 (t2−t3 in FIG. 2B) of voltage vc(t) appearing across capacitor C16, which is applied to winding 143 during time interval (t2−t3), represents the electric energy corresponding to magnetic fluxes which serve to reset the core, saturated at time t1+$\tau$, to the state before time t0. Area S2 can be modified by changing the 0-level period (t2−t3 in FIG. 2A) of control pulse PC (i.e., by changing the duty cycle of pulse PC).

The basic operation of the converter shown in FIG. 1 has been described. Control methods will now be described.

(1) Control by the ON/OFF ratio of driver circuit 15 will first be described.

Figure 2E:
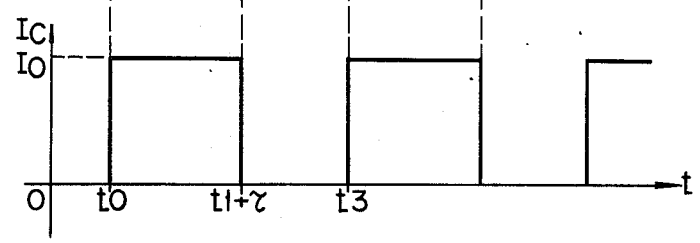

As shown in FIG. 2A, the ON/OFF ratio of circuit 15 is defined by:

$$(t2-t0)/(t3-t0) \tag{8}$$

whereas, the ON/OFF ratio of transistor Q12, shown in FIG. 2E, is given by:

$$(t1+\tau-t0)/(t3-t0) \tag{9}$$

The two ratios of equations (8) and (9) are different.

In order to consider the limit of the ON/OFF ratio of transistor Q12 constituting the main switch, the waveform shown in FIG. 2B applied to winding 143 is important. Area ST of a positive portion of the waveform defines the magnetic fluxes (portion corresponding to $t1+\tau$ in FIG. 3) for setting the magnetic core of current transformer T14, and area S1+S2 of a negative portion thereof defines the magnetic fluxes (portion corresponding to t3=t0 in FIG. 3) for resetting the core. In the stationary state, the setting and resetting magnetic fluxes are equal to each other. In other words, we have:

$$ST=S1+S2 \tag{10}$$

where ST depends on base-emitter saturation voltage VBE(sat) of transistor Q12. When rewritten, we have:

$$ST=(N3/N2) \times VBE(sat) \times (t1-t0+\tau/2) \tag{11}$$

Reset area S2, which is changeable or controllable, is determined by voltage vc(t) appearing across capacitor C16 and by time interval (t3−t2). Thus, S2 can be given by:

$$S2=\{Vb-(Im3/(2\times C16))(t3-t2)\}(t3-t2) \tag{12}$$

Area S1 has a constant value which is determined by the physical properties of circuit elements Q12, T14, etc. in FIG. 1, and is virtually independent of time intervals (t0−t1) and (t2−t3).

The maximum value of area ST shown in FIG. 2B is obtained when $t2=t1+\tau$. The minimum value of area ST is obtained when t2=t3. When switching operation period (t0−t3) in FIG. 1 is set to be longer than period (t0−t3*) in FIG. 2C, and t2 falls between times t3 and t3*, converter output power control cannot be performed by pulse width control of pulse PC.

(2) Converter output power control by drive voltage Vb will now be described.

Resettable area S2 can also be controlled by changing the magnitude of drive voltage Vb for drive circuit 15, as can be seen from equation (12). On the other hand, set area ST has no component depending on drive voltage Vb, as can be seen from equation (11).

From the above, reset area S2 can be primarily controlled by changing drive voltage Vb. Thus, ON/OFF control of transistor Q12 can be performed by changing Vb.

The reason why drive power can be reduced in the embodiment will be described below.

The Power needed for driving transistor Q12 can be classified into four components: (1) a component for turning on the transistor; (2) a component for keeping the transistor in an ON state; (3) a component for turning off the transistor; and (4) a component for keeping the transistor in an OFF state.

(1) The power component for turning on transistor Q12 will first be described.

Transistor Q151 in driver circuit 15 is turned on, so that small pulse current P, which has about 1/5 the magnitude required to saturate transistor Q12, flows. Such small pulse current P triggers a positive feedback in the base-emitter path of transistor Q12 through windings 141 and 142, and transistor Q12 becomes saturated. This pulse current P corresponds to the power for turning on transistor Q12.

(2) The power component for keeping transistor Q12 in the ON state will now be described.

The power required to keep transistor Q12 in ON state is obtained from power source 11 via the feedback operation through windings 141 and 142. Therefore, no power is required to circuit 15.

(3) The power component for turning off transistor Q12 will be described.

Since excess minority carries in the base of transistor Q12 are nullified by increased excitation current Im(t) flowing upon saturation of the core of current transformer T14, no power need be supplied from circuit 15.

(4) The power component for keeping transistor Q12 in the OFF state will be described.

Power for applying a reverse bias between the base and emitter of transistor Q12 is supplied from capacitor C16. The discharge current of capacitor C16 is determined by coercive force Hc of the saturable core of current transformer T14, and it is normally on the order of about 10 mA.

It is seen from the above that the power which has to be supplied by circuit 15 to drive transistor Q12 includes only the power components required to turn on transistor Q12 and to keep it OFF.

In the embodiment shown in FIG. 1, the power component required for keeping transistor Q12 ON is supplied via the positive feedback operation of transistor Q12 from power source 11 of the power converter. The power component for turning off transistor Q12 is obtained by an increase in excitation current Im generated upon saturation of the core of current transformer T14. Therefore, if the power loss due to the hysteresis characteristics of the saturable core is negligible, only the power component of impulse current P (FIG. 2D) for turning on transistor Q12 should be supplied from circuit 15 to transistor Q12. This component may only trigger the positive feedback operation of transistor Q12. Once triggered, transistor Q12 is automatically turned on by a positive feedback operation through windings 141 and 142. Therefore, in this embodiment, bipolar transistor Q12 can be driven, at high speed, with small drive power as in the case of driving an MOSFET.

In this embodiment, since the main switch is constituted by a single bipolar transistor, power loss can be practically made small.

In addition, in the saturation process of the core of current transformer T14 in this embodiment, increased excitation current Im(t) nullifies excess minority carriers in the base of transistor Q12 as it is being turned on. As current Im(t) approaches its maximum, a positive feedback operation is effected through windings 141 and 142, thereby immediately turning off transistor Q12. Accordingly, the ON and OFF times of transistor Q12 are short, and high-speed switching thereof can be performed.

The present invention is not limited to the above embodiments, and various other changes and modifications can be made within the scope of the invention.

Figure 5:
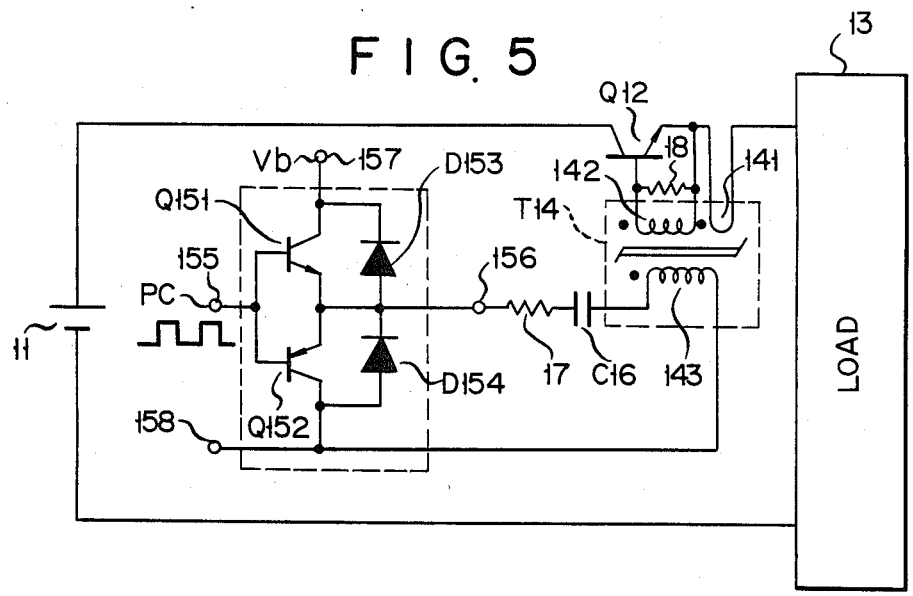
FIG. 5 is a circuit diagram showing a modification of the converter shown in FIG. 1.

For example, as shown in FIG. 5, when resistor 17 is connected in series with capacitor C16, the discharge rate of capacitor C16 can be adjusted and power converter operation can be stabilized.

As is also shown in FIG. 5, when resistor 18 is connected in parallel with winding 142, the range of power control, by means of transistor Q12, can be finely adjusted.

Figure 6:
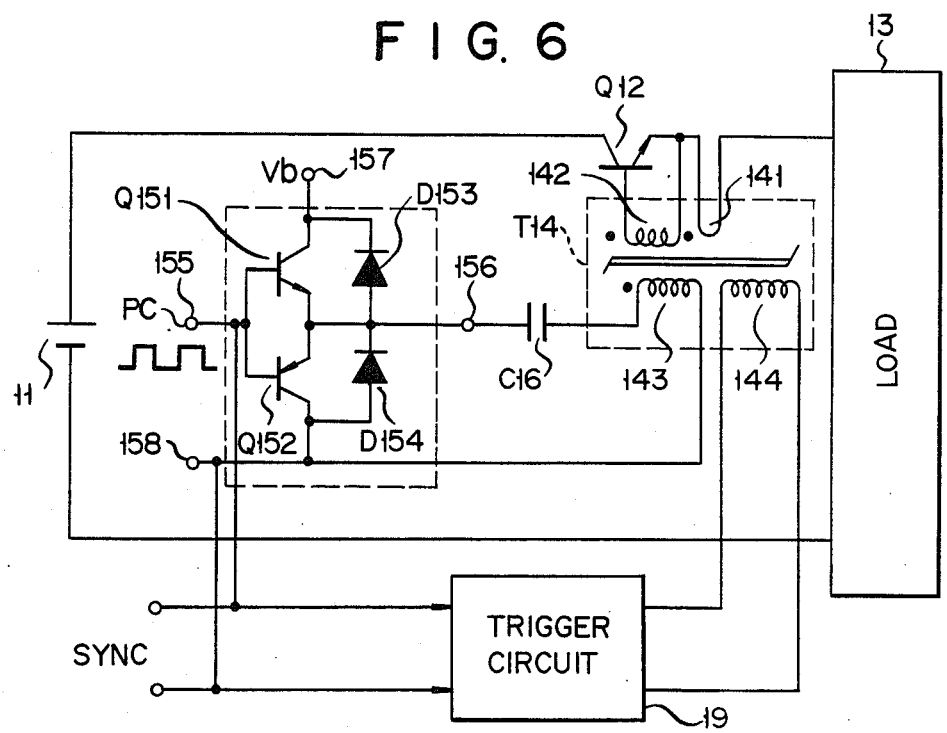
FIG. 6 is a circuit diagram showing another modification of the converter shown in FIG. 1.

In FIG. 6, fourth winding 144 is incorporated in current transformer T14, and a sync pulse is supplied to winding 144 from external trigger circuit 19. With this arrangement, the switching operation of transistor Q12 can be synchronized with the sync pulse without interfering with the basic operation of the power converter. A SYNC signal may be exclusively provided for a reference for trigger circuit 19 to generate the sync pulse. However, if such a SYNC signal is not available, input control pulses PC to driver circuit 15 can be used as the SYNC signal. Then, even where the ON/OFF ratio of transistor Q12 is small, switching operations can be stabilized.

Figure 7:
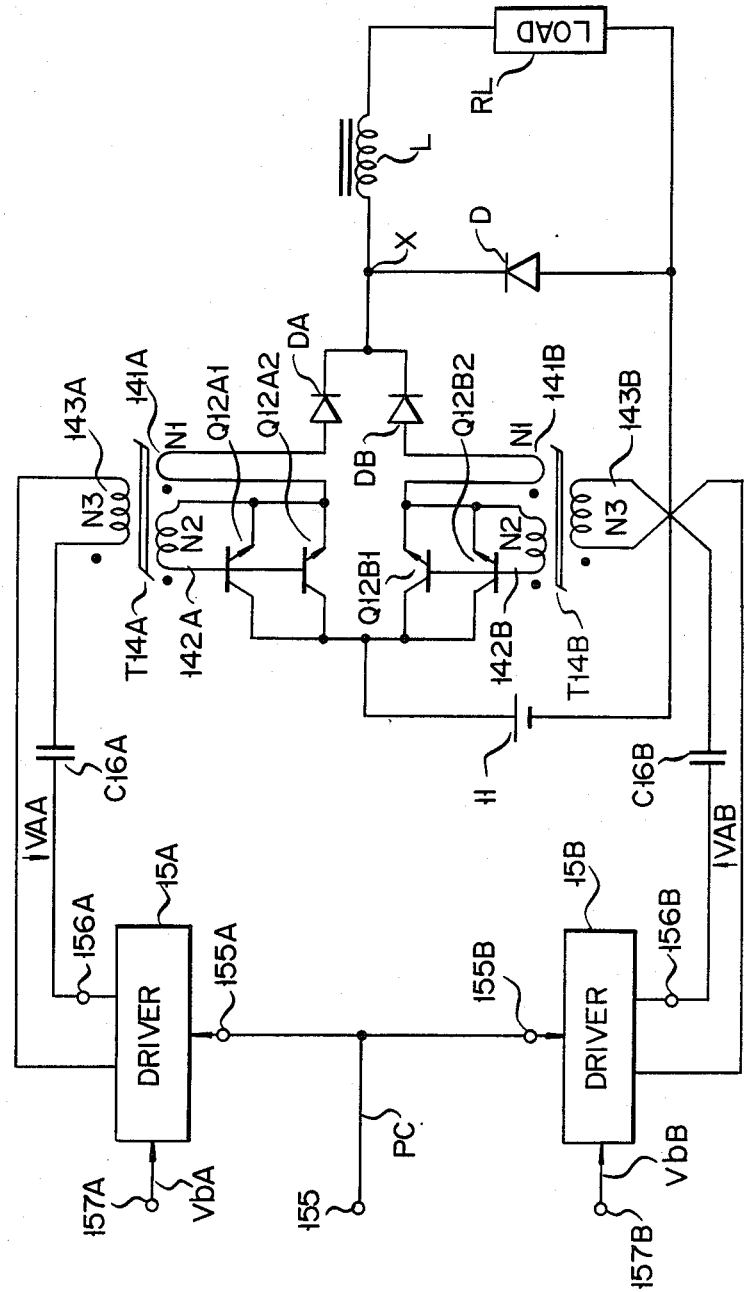
FIG. 7 is a circuit diagram showing a DC/AC inverter according to still another modification of the converter shown in FIG. 1, wherein two parallel main switches (Q12A1, Q12A2, T14A, DA; Q12B1, Q12B2, T14B, DB) are alternately operated.

FIG. 7 shows still another embodiment wherein two sets of main switches of the type shown in FIG. 1 are included and are alternately operated. Control pulse PC (FIG. 2A) is supplied to first and second driver circuits 15A and 15B. Circuits 15A and 15B receive voltages VbA and VbB, respectively. The internal circuit configuration of circuits 15A and 15B may be the same as driver circuit 15 in FIG. 1 (diode D154 in FIG. 1 can be omitted). Output VAA from circuit 15A in-phase drives tertiary winding 143A of current transformer T14A through capacitor C16A. Output VAB from circuit 15B anti-phase drives tertiary winding 143B of current transformer T14B through capacitor T16B. Thus, transformer T14A is set at the leading edge of pulse PC, and transformer T14B is set at the trailing edge thereof (transformers T14A and T14B are automatically reset).

Secondary winding 142A of current transformer T14A is coupled to the base-emitter path of each of parallel npn transistors Q12A1 and Q12A2. Secondary winding 142B of current transformer T14B is coupled to the base-emitter of each of parallel npn transistors Q12B1 and Q12B2. The collectors of transistors Q12A1, Q12A2, Q12B1 and Q12B2 are connected to the positive end of power source 11. The emitters of transistors Q12A1 and Q12A2 are coupled to node X through diode DA and primary winding 141A of transformer T14A. The emitters of transistors Q12B1 and Q12B2 are coupled to node X through diode DB and primary winding 141B of transformer T14B. Node X is coupled to the negative end of power source 11 through the cathode-anode path of diode D. Node X is also coupled to load RL through reactor L.

In the embodiment of FIG. 7, switching transistors Q12A1 and Q121A2 are connected in parallel with each other and switching transistors Q12B1 and Q12B2 are connected in parallel with each other, so that the power handling capacity of the converter is increased. When the frequency of control pulse PC is 5 kHz, 10 kHz AC power is supplied to load RL. THus, FIG. 7 shows an embodiment wherein the present invention is applied to a DC/AC power converter (inverter).

Figure 8:
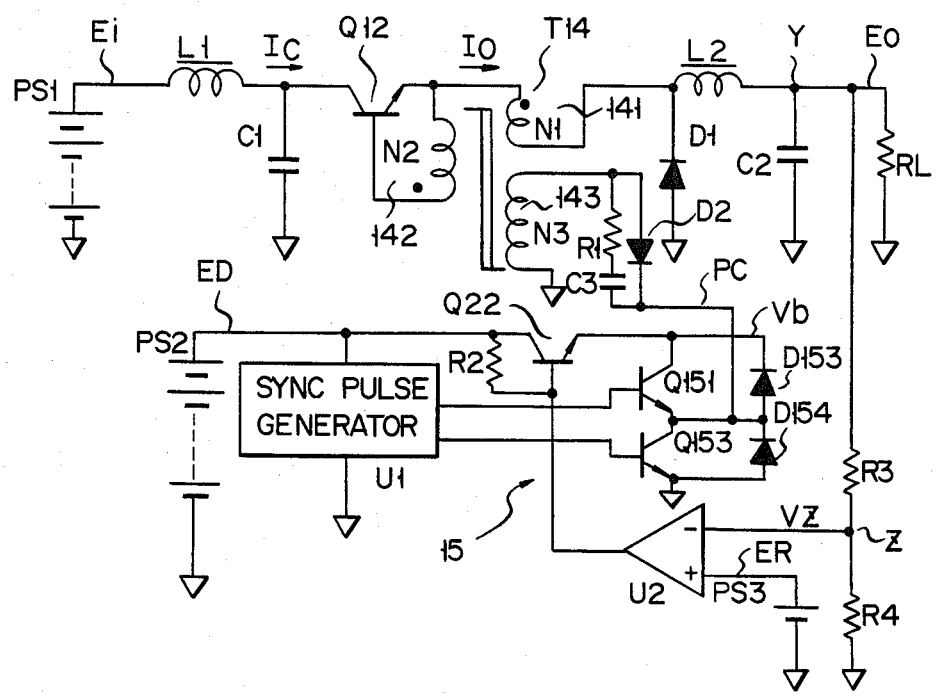
FIG. 8 shows another embodiment of a switching power converter to which the method of the present invention is applied, which includes a negative feedback loop for automatically stabilizing a power converted output voltage (Eo)

FIG. 8 shows a voltage-step-down type switching DC/DC power converter wherein power converted DC output voltage Eo is stabilized by a negative feedback operation. The collector of npn power transistor Q12 is coupled to DC input power source PS1 through an input filter consisting of reactor L1 and capacitor C1. Secondary winding 142 of current transformer T14 with a saturable magnetic core is connected between the base and emitter of transistor Q12. The emitter of transistor Q12 is connected to one end of primary winding 141 of current transformer T14. The other end of winding 141 is connected to the cathode of flywheel diode D1 which is provided for supplying power to a load (RL) while transistor Q12 is OFF. The other end of winding 141 is also coupled to load resistor RL through an output filter consisting of reactor L2 and capacitor C2. Node Y between load resistor RL and output filter (L2, C2) is connected to a series circuit of voltage-division resistors R3 and R4. Tertiary winding 143 of current transformer T14 is connected to the anode of diode D2 and to the cathode thereof through a series circuit of resistor R1 and capacitor C3. The cathode of diode D2 is connected to the emitter of npn transistor Q151 and to the collector of npn transistor Q153. Protection diode D153 is connected in parallel to the collector-emitter path of transistor Q151. Protection diode D154 is connected in parallel to the collector-emitter path of transistor Q153. The bases of transistors Q151 and Q153 are connected to sync pulse generator U1. The collector of transistor Q151 is connected to the emitter of npn transistor Q22. Transistor Q22 is provided for controlling reset voltage Vb for current transformer T14. The collector of transistor Q22 is connected to power source PS2 for driver circuit 15. Power source PS2 supplies power to generator U1. Resistor R2 is connected in the collector-base path of transistor Q22, and the base of transistor Q22 is connected to the output terminal of operational amplifier U2. The inverting input terminal of operational amplifier U2 is connected to node Z between resistors R3 and R4. The noninverting input terminal of operational amplifier U2 is connected to DC power source PS3 for supplying reference potential ER. In FIG. 8, reference symbol Ei denotes an input voltage of the switching power converter; Eo, an output voltage thereof; and ED, a power source voltage for driver circuit 15.

Turn ratio N1/N2 of primary winding 141 vs. secondary winding 142 of current transformer T14 is determined to satisfy:

$$IB = IC/\beta F \tag{13}$$

so that base current IB derived from collector current Ic is sufficient to turn on transistor Q12. Note that $\beta F$ must satisfy:

$$\beta F \leq hFE \tag{14}$$

where hFE is the current amplification factor of transistor Q12. Oscillation frequency f of the main switch (Q12, T14) is given by:

$$f = (VBE/4N2AB_m) \times 10^8 (Hz) \tag{15}$$

where $B_m$ is the saturated magnetic flux density of the core of current transformer T14, A is the cross-sectional area (cm²) of the core, N2 is the number of turns of secondary winding 142, and VBE is the base-emitter voltage of transistor Q12 when it is ON. Tertiary winding 143 is incorporated in transformer T14 which satisfies relations (14) and (15), and drive control signal Vb is applied to winding 143.

The operation of the circuit shown in FIG. 8 will be described.

Drive power source PS2 supplies power to sync pulse generator U1, transistor Q22 and operational amplifier U2. The voltage waveform Vb from transistors Q151 and Q153 driven by generator U1 becomes as shown in FIG. 2A. In the ON period of transistor Q151, voltage Vb is applied to tertiary winding 143 of transformer T14 through resistor R1 and capacitor C3. Resistor R1 and capacitor C3 constitute a differentiator which supplies a sharp impulse (FIG. 2D) to the base of transistor Q12 through secondary winding 142 of transformer T14. When transistor Q12 is turned on, a positive feedback current flows from winding 141 to winding 142, and transistor Q12 is rendered ON. Since transistor Q12 is designed to perform blocking oscillation at the self-excitation frequency given by equation (15), it turns off by itself. Therefore, circuit 15 is free of any current for turning off transistor Q12. In other words, no drive power is required to turn off the main switch. Since the time necessary for the ON drive operation of transistor Q12 (pulse width of impulse P in FIG. 2D) is less than 1 $\mu$sec, average power for switching drive of transistor Q12 is minimized. Magnetic energy accumulated in transformer T14 in the ON period of transistor Q151 (t0−t2 in FIG. 2A) is consumed in the ON period of transistor Q153 (t2−t3 in FIG. 2A).

Figure 3:
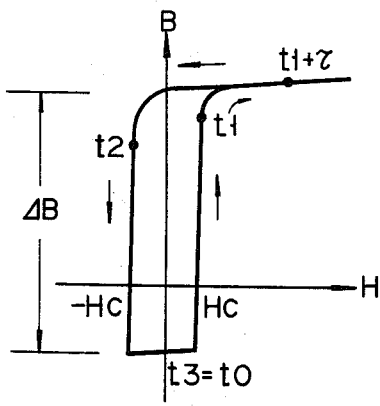
FIG. 3 is a graph showing the B-H characteristics explaining how the magnetic core of a current transformer (T14) used in the power converter in FIG. 1 is magnetized.

Since current transformer T14 has the magnetic characteristics shown in FIG. 3, the ON/OFF duty ratio of transistor Q12 can be modified by changing the magnitude of reset voltage Vb applied by transistor Q151 (cf. FIGS. 2A, 2B, 2E, and Eq. 12). Voltage VZ at node Z, obtained by dividing output voltage Eo by resistors R3 and R4, is compared with reference voltage ER. The difference voltage (ER−VZ) is amplified by operational amplifier U2, and the base voltage of transistor Q22 is changed by the output from operational amplifier U2. Output voltage Vb from transistor Q22 can thus be controlled. With this control method, output voltage Eo supplied to load resistor RL can be stabilized.

In the circuit shown in FIG. 8, a negative feedback loop is formed in the circuit loop of Y→Z→U2→Q22 Q151→T14, Q12→L2→Y. Output voltage Eo automatically converges, as a result of this negative feedback loop operation, to a value corresponding to reference potential ER.

The above embodiment is described with reference to a back type DC/DC converter. However, the present invention can be similarly applied to other devices in which high-power transistors must be switched, such as boost type DC/DC converters, buck-boost type DC/DC converters, and DC/AC inverters.

Figure 9:
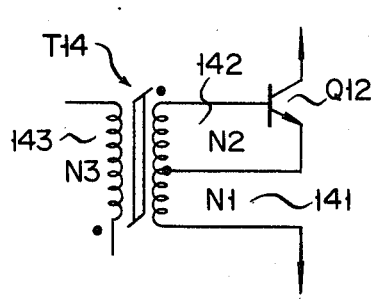
FIG. 9 shows a modification in the connection of a switching transistor (Q12) to the current transformer (T14) in FIG. 1.
Figure 10:
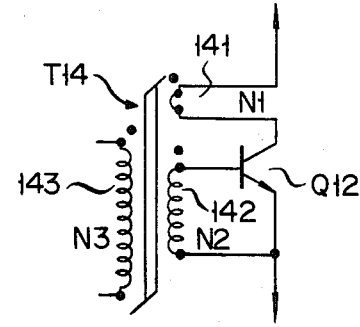
FIG. 10 shows still another modification in the connection of the transistor (Q12) to the current transformer (T14) in FIG. 1.

FIGS. 9 and 10 show modifications of the connection between switching transistor Q12 and current transformer T14 shown in FIG. 1. Primary and secondary windings (N1 and N2) in current transformer T14 in FIG. 1 are independent of each other. However, in FIG. 9, the primary and secondary windings are integrated as a single winding, and the intermediate tap is connected to the emitter of switching transistor Q12. In FIG. 1, the primary winding (N1) is connected to the emitter circuit of switching transistor Q12. However, in FIG. 10, the primary winding is connected to the collector circuit of transistor Q12. When the winding start position of the primary and secondary windings is determined as indicated by the dots in FIG. 10, positive current feedback of transistor Q12 through current transformer T14 can be performed even if the primary winding (N1) is at the side of the collector.

What is claimed is:

1. A drive method for a switching power converter which includes a current transformer having primary, secondary, and tertiary windigs wound around a saturable magnetic core, and a switching transistor having a base emitter path or base-collector path positively feedback-coupled through the primary and secondary windings of said current transformer, said drive method comprising the steps of:
   (a) applying a drive pulse to the tertiary winding of said current transformer to turn on said switching transistor at a leading edge of said drive pulse, so that an emitter current or collector current of said switching transistor flows into the primary winding of said current transformer;
   (b) magnetically saturating the core of said current transformer by the emitter current or collector current of said switching transistor, so that an inductance of the secondary winding of said current transformer is reduced by magnetic saturation of said core;
   (c) flowing a turn-off current, in a direction to turn off said switching transistor, between said secondary winding and the base of said switching transistor upon a decrease in inductance at the secondary winding of said current transformer; and
   (d) setting a trailing edge of said drive pulse applied to the tertiary winding of said current transformer to occur at a time after the flow of said turn-off current is terminated, wherein an ON/OFF duty cycle of said switching transistor can be changed by changing a period from the trailing edge of said drive pulse to the next leading edge thereof.

2. A drive method according to claim 1, wherein an ON/OFF duty cycle of said switching transistor can be changed by changing an amplitude of said drive pulse.

3. A switching power converter comprising:
   a current transformer having primary, secondary and tertiary windings wound around a saturable magnetic core;
   a switching transistor having a base-emitter path or base-collector path positively feedback-coupled through the primary and secondary windings of said current transformer;
   drive means for applying a drive pulse to the tertiary winding of said current transformer to turn on said switching transistor at a leading edge of said drive pulse, so that an emitter current or collector current of said switching transistor flows into the primary winding of said current transformer, for causing magnetic saturation of the core of said current transformer by the emitter current or collector current of said switching transistor, so that an inductance of the secondary winding of said current transformer is reduced by the magnetic separation of said core and for causing a turn-off current, in a direction to turn off said switching transistor, between said secondary winding and the base of said switching transistor upon a decrease in inductance at the secondary winding of said current transformer, and for setting a trailing edge of said drive pulse applied to the tertiary winding of said current transformer to occur at a time after the flow of said turn-off current is terminated, wherein an ON/OFF duty cyle of said switching transistor is changed by changing a period from the trailing edge of said pulse to the next leading edge thereof.

4. A switching power converter according to claim 3 wherein said drive means includes
drive circuit means, responsive to a control pulse with a given duty cycle, for generating said drive pulse having the same duty cycle as said control pulse and a given amplitude; and
capacitor means, inserted between said drive circuit means and the tertiary winding of said current transformer, for differentiating said drive pulse with respect to time and converting it into a drive current pulse.

5. A switching power converter according to claim 4, wherein the secondary winding of said current transformer is inserted in the base-emitter path of said switching transistor; and said given amplitude of said drive pulse satisfies:

$$Vb \geq vc + (N3/N2)VBE(sat)$$

where N2 is the number of turns of said secondary winding, N3 is the number of turns of said tertiary winding, VBE(sat) is the base-emitter voltage in an ON period of said switching transistor, vc is the voltage drop appearing across said capacitor means, and Vb is the voltage applied to said capacitor means by said drive pulse.

6. A switching power converter according to claim 4, wherein said drive circuit means is formed of a complementary emitter follower circuit.

7. A switching power converter according to claim 4, wherein said current transformer has a sync winding which receives a given sync pulse, so that an ON/OFF operation of said switching transistor is synchronized with said given sync pulse.

8. A switching power converter according to claim 4, said switching power converter further comprising:
output circuit means, coupled to said current transformer, for providing an output voltage corresponding to said emitter current; and
control circuit means, coupled to said output circuit means and said drive circuit means, for comparing a given reference potential with a comparison potential corresponding to said output voltage, and for changing said given amplitude in accordance with the result of the comparison, so that said output voltage is converged at a voltage corresponding to said given reference potential.

9. A switching power converter according to claim 3, wherein said current transformer comprises a first current transformer having primary, secondary and tertiary windings, and a second current transformer having primary, secondary and tertiary windings,
wherein said switching transistor comprises a first switching transistor, a base-emitter or base-collector path of which is positively feedback-coupled through the primary and secondary windings of said first current transformer; and a second switching transistor, a base-emitter or base-collector path of which is positively feedback-coupled through the primary and secondary windings of said second current transformer,
wherein a collector-emitter path of said first switching transistor is parallel-coupled to a collector-emitter path of said second switching transistor, and
wherein a phase in which said first switching transistor is turned on differs from that in which said second switching transistor is turned on, provided that the reference of the phase is based on a phase of said drive pulse.

10. A switching power converter according to claim 3, wherein said ON/OFF duty cycle of said switching transistor is changed by changing an amplitude of said drive pulse.

* * * * *